United States Patent [19]

Debaisieux et al.

[11] Patent Number: 4,626,732
[45] Date of Patent: Dec. 2, 1986

[54] PIEZOELECTRIC RESONATOR

[75] Inventors: André Debaisieux, Maison Laffitte; Jean P. Aubry, Asnieres, both of France

[73] Assignee: Compagnie d'Electronique et de Piezo-Electricite C.E.P.E., Argenteuil, France

[21] Appl. No.: 716,403

[22] Filed: Mar. 27, 1985

[30] Foreign Application Priority Data

Mar. 30, 1984 [FR] France ................ 84 05036

[51] Int. Cl.$^4$ ........................................ H01L 41/08
[52] U.S. Cl. ..................... 310/348; 310/349; 310/353; 310/346; 310/369
[58] Field of Search ............... 310/321, 323, 328, 348, 310/349, 351, 352, 353, 363, 369, 346

[56] References Cited

U.S. PATENT DOCUMENTS

| 4,216,402 | 8/1980 | Engdahl | 310/353 X |
| 4,322,652 | 3/1982 | Otsuka | 310/363 X |
| 4,329,613 | 5/1982 | Kinzel et al. | 310/353 X |

FOREIGN PATENT DOCUMENTS 2755116 6/1979 Fed. Rep. of Germany ...... 310/353

Primary Examiner—Patrick R. Salce
Assistant Examiner—Emanuel Todd Voeltz
Attorney, Agent, or Firm—Oblon, Fisher, Spivak, McClelland & Maier

[57] ABSTRACT

A piezoelectric resonator including a base, two conducting posts which pass through the base and a piezoelectric plate. The plate includes a central active zone which is surrounded by a peripheral zone. The two zones are connected by at least two bridges which define slits which separate the central zone from the peripheral zone. Each face of the central zone is covered with an adherent electrode which extends over one of the bridges to a part of the peripheral zone. Each of the electrodes is connected to one of the conducting posts through a conductive metal ribbon. Each of the metal ribbons bear on the inner part of the peripheral zone so that the ribbon is disposed substantially as an extension of the corresponding posts.

5 Claims, 2 Drawing Figures

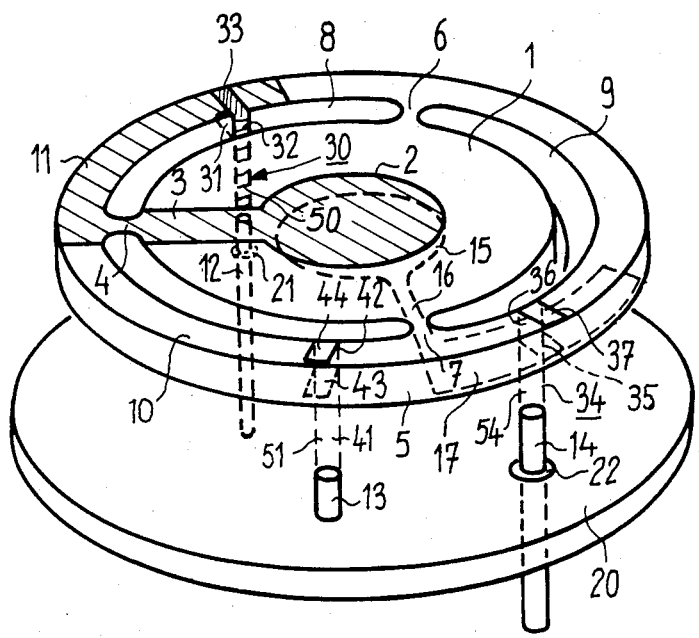
FIG_1
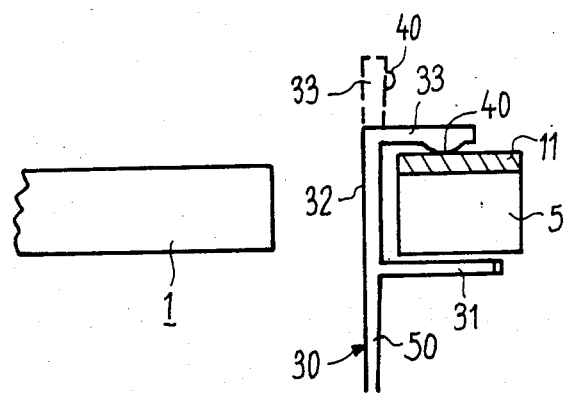
FIG_2

PIEZOELECTRIC RESONATOR

BACKGROUND OF THE INVENTION

1. Field of the Invention

The present invention relates to a piezoelectric resonator comprising a base through which pass two conducting posts electrically isolated therefrom and a piezoelectric plate comprising a central active zone surrounded by a peripheral ring connected to the central zone by at least two bridges defining slits separating the central zone from the peripheral ring, each face of the central zone being covered with an adherent electrode extending through one at least of the bridges over a part of the peripheral rings, each electrode of the plate being connected to one of the conducting posts through a conducting fixing means.

2. Description of the Prior Art

Resonators of this type have been described in French Patent Applications Nos. 83/15 652 entitled "High Overvoltage Self Suspended Resonator", 83/15 653 entitled "Resonator With Low Acceleration Sensitivity" and 83/15 654 entitled "Piezoelectric Resonator for Severe Environment", which applications were filed jointly by the applicant on Sept. 30, 1983. The contents of these different applications are incorporated by reference in the present application.

These different piezoelectric resonators are held secured to the base by conducting posts passing through said base and electrically connected to the electrodes of the piezoelectric plate on the external edge of the peripheral ring of said plates. However, in practice, so as to reduce production costs, commercially available bases are generally used whatever the dimensions of the piezoelectric plates fixed inside the case. It has generally been discovered that the diameter of these piezoelectric plates is different and in most cases greater than the diameter at which the posts of the base are disposed. The result is that the means for fixing the posts to the quartz plate are formed from metallic wires or ribbons slanted with respect to the direction of said posts. It has generally been noted that the performance of the resonators, using the above fixing methods, are fairly mediocre as regards sensitivity to acceleration. Generally, for a traditional quartz plate, i.e. not provided with slits as in the case of the present invention, the sensitivity to accelerations of the resonators thus obtained is not less than $1 \times 10^{-9}/G$. In addition, such a value of sensitivity to acceleration is not easily reproducible from one resonator to another. When piezoelectric plates are used having slits in accordance with the above mentioned application 83/15 653, this sensitivity to acceleration is considerably increased since a sensitivity is obtained less than $1 \times 10^{-9}/G$. But, as in the preceding case, and although the overall results are improved, a great dispersion of this sensitivity value is noted in the same manufacturing batch.

So at the present time there exists no system for fixing the piezoelectric plates to the posts of the base so as to obtain accelerometric sensitivities less than $1 \times 10^{-9}/G$ with good reproducibility of the value of the sensitivity to acceleration.

SUMMARY OF THE INVENTION

The present invention overcomes the problem thus posed. In the resonator of the invention, said fixing means are formed by a metal ribbon bearing on the inner part of the peripheral zone, so that said ribbon is disposed substantially in the extension of the corresponding post.

In a variant, in the resonator of the invention said base also comprises at least one holding post connected to the resonator by means of a metal ribbon bearing on the inner part of the peripheral zone of the resonator so that said ribbon is disposed substantially in the extension of the corresponding post, said ribbon being disposed so as to avoid any electric contact between the holding post and the electrodes of the plate.

Preferably, the dimensions of the slit in which the metal ribbons bear are adjacent those of the fixing ribbon used.

It has been discovered that, with the resonators constructed in accordance with the invention, sensitivities to acclerations may be obtained less than $1 \times 10^{-9}/G$ with a very high success rate. In fact, as will be seen from the comparative example given further on, not only can the sensitivity to acceleration of the resonator be improved but the efficiency of the operation can be substantially multiplied by three by using the invention.

BRIEF DESCRIPTION OF THE DRAWINGS

The invention will be better understood from the following embodiments, given by way of non limiting example, with reference to the Figures which show:

FIG. 1, a view of a piezoelectric plate fixed to a base in accordance with the invention, FIG. 2, a sectional view of the preceding Figure at the of one fixing means.

DESCRIPTION OF THE PREFERRED EMBODIMENT

In FIG. 1 is shown a view of a piezoelectric plate connected to the posts of the base by fixing means in accordance with the invention. The piezoelectric plate comprises a central active zone 1, surrounded by a peripheral ring 5, connected to this latter by three bridges, in the present example 4, 6, 7. These bridges 4, 6, 7 define slits 8, 9 and 10 separating the central zone 1 from the peripheral ring 5. Each face of the central zone 1 is covered with an adherent electrode 2, 15 deposited in a way known per se. Each electrode 2, 15 extends, through one at least of the bridges respectively 4 and 7, over a part 11, 17 of the peripheral ring 5. Each electrode 2, 15 of the piezoelectric plate is thus connected to one of the conducting posts 12, 14 passing through base 20 through an insulating glass bead 21, 22 by conductor fixing means 30, 34. These conductor fixing means 30 34 are formed respectively by a rectilinear conducting part in the form of a flat ribbon 50, 54 soldered respectively to the end of post 12, 14. This rectilinear part 30, 34 (situated in the extension of post 12, 14 and so substantially perpendicular to the horizontal base 20) is extended by a substantially horizontal flat rectilinear part 31, 35 and a substantially vertical part 32, 36, itself extended by a horizontal part 33, 37. The assembly 31, 32, 33 and 35, 36, 37 nips the peripheral ring 5 of the piezoelectric plate, the rectilinear part 32, 36 being situated in the vicinity of the inner edge, on the slit side 8, 9 of said peripheral ring 5. The horizontal rectilinear part 33, 35 makes electric contact with part 11, 17 extending respectively each metal electrode 2, 15. Of course, the presence of these two fixing means is indispensible for operation of the invention. However, it is possible to provide additionally other fixing means having a structure quite identical to those described above but having no electric connection function. These means are shown in the extension of post 13 integral with the base but not isolated electrically therefrom. These means 41 are formed by a substantially vertical flat part 51 integral with the end of post 13 which is extended as before by a U shaped clip comprising three arms 43, 42 and 44, arm 43 being disposed below the peripheral ring 5, arm 42 in the extension of 51 and on the internal face of the peripheral ring 5, in slit 7, and arm 44 being disposed substantially horizontally above said peripheral ring 5.

FIG. 2 shows a sectional view of the resonator of FIG. 1, at the level of the fixing means 30. In this Figure, the same elements as those in the preceding Figure bear the same references. It will be noted in particular that, preferably, the lower part of the upper arm 33 of the U shaped clip 31, 32, 33 comprises a boss 40 for improving the electric contact with the metallization 11 which extends electrode 2. It will be also noted that, so as to provide easy fixing of the piezoelectric plate, in accordance with the invention, the upper part 33 of the clip is first of all held in the extension of the part of the base 32 of the U, then the quartz plate is inserted so that the fixing means 30 slide into the corresponding slits in said plate, then part 33 is bent back over the metallized part 11, forming an extension of electrode 2, using an appropriate tool, this bending being accomplished substantially at an angle of 90°.

Generally, flat nickel ribbons will be used as fixing means 30 and 34. These ribbons, connecting the plate of the resonator to the insulating throughposts 12, 14 must be held as perpendicularly as possible with respect to the plane of base 20 (or to the lower plane, on the metallization side of electrode 15 of the resonator), while remaining upright, i.e. substantially in the vertical direction in the Figure between the plate and the base. Generally also, these fixing means are applicable to all resonators having slits, i.e. having a plurality of bridges and slits between the vibrating plate and a peripheral ring. Preferably, the invention will be applied to plates comprising slits, those corresponding to the passage of the metal ribbons being of small size, simply letting said nickel ribbons pass therethrough.

Fixing of the plate to the ribbon shaped support may be provided by a conducting cement known per se, the support then possibly having two parts, one, bent such as for Example 31, in FIG. 2, the other 33 being bent back after the plate has been positioned on the parts such as 31.

PRACTICAL CONSTRUCTIONAL EXAMPLE

Piezoelectric resonators are formed such as described in Example 3 of the above mentioned French Patent Application No. 83/15 653, i.e. plano-convex 10 MHz resonators of SCP 3 type comprising four bridges disposed at ±15° with respect to the axis ZZ'. The outer diameter of the plate is 15 mm. The diameter of the active part is 10 mm with an electrode metallization diameter of 6 mm. The peripheral ring has a width of 1.5 mm whereas each slit has a width of 1 mm.

A quartz plate such as defined above is fixed to a standard base whose posts are disposed on a circle. These posts have a diameter of about 1 mm. They are tangent to a circle of 10 mm in diameter on the outside thereof. In the first case, the quartz plate is fixed in the usual way, i.e. using flat ribbons forming springs, fixed on the outside of the posts (circle of diameter 12 mm) on the one hand and on the outside of the peripheral ring on the other (circle of diameter 15 mm). The springs therefore comprise a part slanting by about 15°, with respect to the axis of the posts.

In the second case, in accordance with the invention, the metal ribbon such as described above is fixed to the inner face of the peripheral ring on the one hand (preferably in the shortest slits, substantially in the middle) and to the inner face of the posts (circle of diameter 10 mm) on the other. The metal ribbons of the invention are therefore placed substantially in the extension of the corresponding post.

It has been discovered that, for a batch of resonators produced in accordance with the first case, only 30% of resonators are obtained having a sensitivity to accelerations less than $3 \times 10^{-10}/G$, whereas for a batch of resonators using the fixing means according to the second case, a sensitivity to accleration less than $3 \times 10^{-10}/G$ can be obtained for 80% of the resonators.

We claim:

1. A piezoelectric resonator comprising a base through which pass two conducting posts insulated therefrom and a piezoelectric plate comprising a central active zone surrounded by a peripheral ring connected to said central zone by at least two bridges defining slits separating the central zone from said peripheral zone, each face of the central zone being covered with an adherent electrode extending through at least one of said bridges over a part of said peripheral ring, each electrode of said plate being connected to one of the conducting posts through conducting fixing means, wherein said conducting fixing means are formed by a metal ribbon bearing on the inner part of said peripheral zone so that said ribbon is disposed substantially in the extension of the corresponding post.

2. The resonator as claimed in claim 1, wherein said base also comprises at least one holding post connected to the resonator by means of a metal ribbon bearing on the inner part of said peripheral zone, so that said ribbon is disposed substantially in the extension of the corresponding post, said ribbon being fixed to said ring so as to avoid any electrical contact between the holding post and the electrodes of said plate.

3. The resonator as claimed in claim 1, wherein the dimensions of said slit in which said metal ribbons bear are close to those of the ribbon used.

4. The resonator as claimed in claim 1, wherein said ribbon comprises a first arm parallel to the base disposed under said peripheral ring and a second arm disposed on the peripheral ring, parallel to said base.

5. The resonator as claimed in claim 4, wherein said second arm is constituted by the extremity of the ribbon opposite to the corresponding conducting post which is bent back.

* * * * *